United States Patent
Shirakura et al.

(10) Patent No.: US 11,360,676 B2
(45) Date of Patent: Jun. 14, 2022

(54) MEMORY SYSTEM

(71) Applicant: KIOXIA CORPORATION, Tokyo (JP)

(72) Inventors: Hiroya Shirakura, Fujisawa Kanagawa (JP); Shinya Takeda, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/003,840

(22) Filed: Aug. 26, 2020

(65) Prior Publication Data

US 2021/0294504 A1 Sep. 23, 2021

(30) Foreign Application Priority Data

Mar. 17, 2020 (JP) .............................. JP2020-046067

(51) Int. Cl.
*G06F 3/06* (2006.01)
*G11C 16/04* (2006.01)
*G11C 16/30* (2006.01)

(52) U.S. Cl.
CPC .......... *G06F 3/0625* (2013.01); *G06F 3/0632* (2013.01); *G06F 3/0679* (2013.01); *G11C 16/0483* (2013.01); *G11C 16/30* (2013.01)

(58) Field of Classification Search
CPC .... G06F 3/0625; G06F 3/0679; G06F 3/0632; G11C 16/0483; G11C 16/30; G11C 5/14; G11C 5/066; G11C 7/1084; G11C 2207/105; G11C 16/10

USPC .......................................................... 711/103
See application file for complete search history.

(56) References Cited

U.S. PATENT DOCUMENTS

| | | | |
|---|---|---|---|
| 10,289,589 B2 | 5/2019 | Chhor et al. | |
| 10,586,599 B1* | 3/2020 | Kubota | G11C 16/10 |
| 10,621,034 B2 | 4/2020 | Kodera et al. | |
| 2018/0322086 A1 | 11/2018 | Tailliet et al. | |
| 2020/0293198 A1* | 9/2020 | Anazawa | G06F 3/0679 |
| 2020/0371697 A1* | 11/2020 | Kao | G11C 16/22 |

FOREIGN PATENT DOCUMENTS

| | | | | |
|---|---|---|---|---|
| CN | 104425014 A | * | 3/2015 | |
| CN | 105095000 A | * | 11/2015 | .......... G06F 11/1417 |
| CN | 105992445 A | * | 10/2016 | |
| JP | 2015055983 A | | 3/2015 | |
| JP | 2017045391 A | | 3/2017 | |

* cited by examiner

*Primary Examiner* — Fernando Hidalgo
(74) *Attorney, Agent, or Firm* — Kim & Stewart LLP

(57) ABSTRACT

According to one or more embodiments, a memory system includes a signal terminal, a power line, a resistance element, a nonvolatile semiconductor memory, and a controller. The resistance element is provided between the signal terminal and the power line. The nonvolatile semiconductor memory is configured to transmit and receive a signal to and from a host device via the signal terminal. The controller is configured to determine whether to connect the signal terminal to the power line via the resistance element.

15 Claims, 8 Drawing Sheets

| SETTING REGISTER | | PULL-UP CONNECTION | PULL-DOWN CONNECTION |
|---|---|---|---|
| 0 | 0 | Off | Off |
| 0 | 1 | Off | On |
| 1 | 0 | On | Off |

FIG. 7

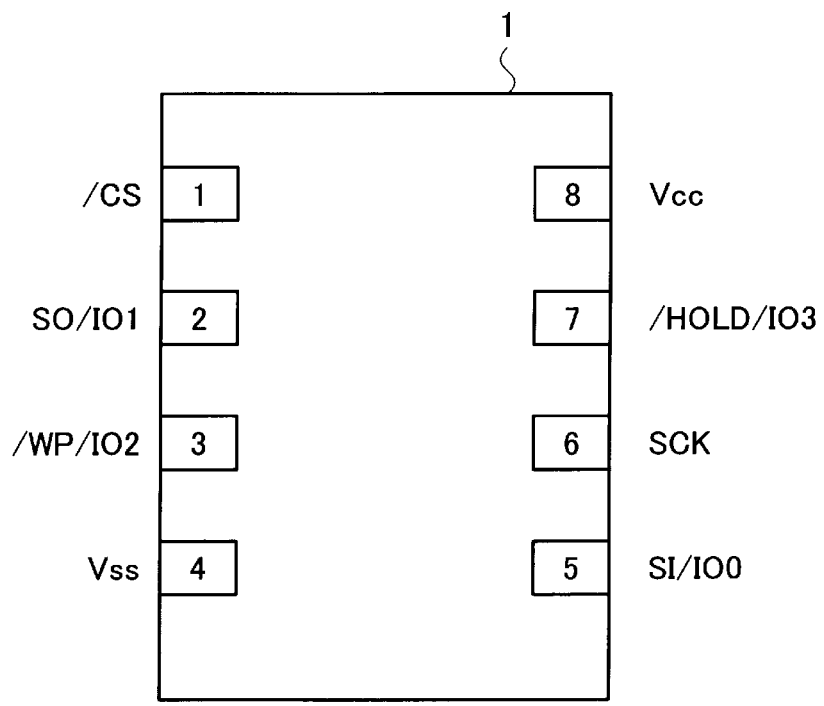

| /CS | 1 | | 8 | Vcc |
| SO/IO1 | 2 | | 7 | /HOLD/IO3 |
| /WP/IO2 | 3 | | 6 | SCK |
| Vss | 4 | | 5 | SI/IO0 |

FIG. 8

| No | FUNCTION | | |
|---|---|---|---|
| | TERMINAL NAME | X1 OPERATION | X4 OPERATION |
| 1 | /CS | CS SIGNAL RECEIVING TERMINAL | |
| 2 | SO/IO1 | SERIAL DATA OUTPUT TERMINAL | IO TERMINAL THROUGH WHICH SERIAL DATA PROPAGATES |
| 3 | /WP/IO2 | WP SIGNAL RECEIVING TERMINAL | IO TERMINAL THROUGH WHICH SERIAL DATA PROPAGATES |
| 4 | Vss | Vss TERMINAL | |
| 5 | SI/IO0 | SERIAL DATA INPUT TERMINAL | IO TERMINAL THROUGH WHICH SERIAL DATA PROPAGATES |
| 6 | SCK | SERIAL CLOCK SIGNAL RECEIVING TERMINAL | |
| 7 | /HOLD/IO3 | HOLD SIGNAL RECEIVING TERMINAL | IO TERMINAL THROUGH WHICH SERIAL DATA PROPAGATES |
| 8 | Vcc | Vcc TERMINAL | |

FIG. 13

| RESISTANCE VALUE REGISTER | | CANDIDATE RESISTANCE VALUE |
|---|---|---|
| 0 | 0 | 1KΩ |
| 0 | 1 | 10KΩ |
| 1 | 0 | 50KΩ |
| 1 | 1 | 100KΩ |

FIG. 14

| /WP | | | | /HOLD | | | |
|---|---|---|---|---|---|---|---|
| SETTING REGISTER | | RESISTANCE VALUE REGISTER | | SETTING REGISTER | | RESISTANCE VALUE REGISTER | |
| 0 | 0 | 0 | 0 | 0 | 0 | 0 | 0 |
| 0 | 1 | 0 | 1 | 0 | 1 | 0 | 1 |
| 1 | 0 | 1 | 0 | 1 | 0 | 1 | 0 |
| - | - | 1 | 1 | - | - | 1 | 1 |

MEMORY SYSTEM

CROSS-REFERENCE TO RELATED APPLICATION(S)

This application is based upon and claims the benefit of priority from Japanese Patent Application No. 2020-046067, filed Mar. 17, 2020, the entire contents of which are incorporated herein by reference.

FIELD

Embodiments described herein relate generally to a memory system.

BACKGROUND

With a higher functionality of a system, a memory capacity of a nonvolatile semiconductor memory provided in a memory system has increased. For example, as the nonvolatile semiconductor memory, a NAND flash memory has been used for it has a low bit cost and can easily increase its memory capacity.

In a NAND flash memory that confirms to a serial peripheral interface, in order to prevent an operation failure, a pull-up resistor or a pull-down resistor may be connected to one or more signal terminals to which a control signal is input. However, when these signal terminals are used as input and output terminals of data, an unnecessary current may flow via the pull-up resistor or the pull-down resistor.

Hence, there is a need for a memory system capable of preventing unnecessary current flow and reducing operating power.

DESCRIPTION OF THE DRAWINGS

FIG. 7 depicts a terminal arrangement of a memory system according to a first embodiment.

FIG. 8 is a table showing functions of terminals of a memory system according to a first embodiment.

FIG. 13 is a table showing an example of a resistance value selection setting register of a memory system according to a second embodiment.

FIG. 14 is a table showing an example of a setting register and a resistance value selection setting register of a memory system according to a second embodiment.

DETAILED DESCRIPTION

Figure 1:
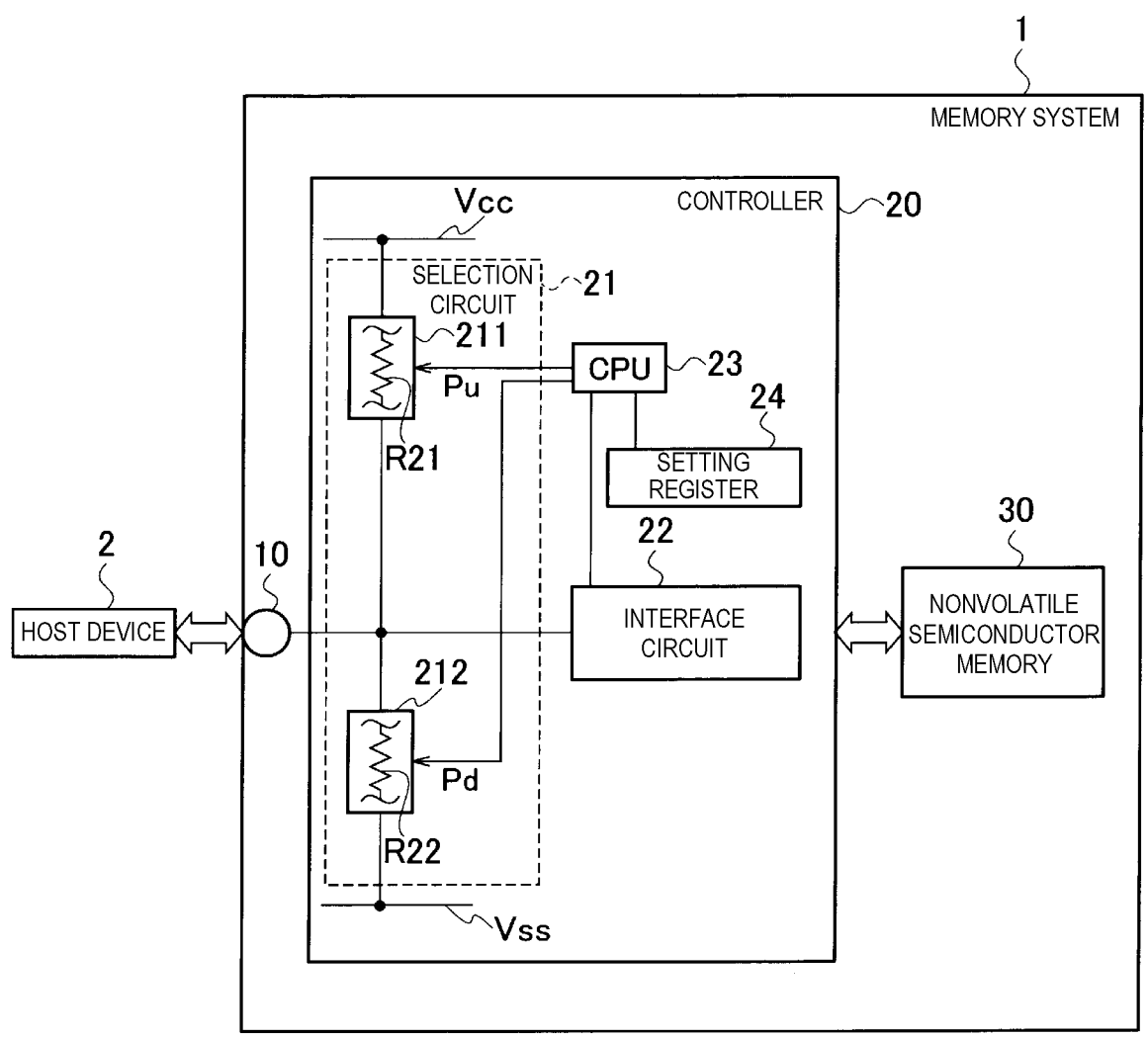
FIG. 1 depicts a memory system according to a first embodiment.

According to one or more embodiments, a memory system includes: a signal terminal; a power line; a resistance element; a nonvolatile semiconductor memory; and a controller. The resistance element is provided between the signal terminal and the power line. The nonvolatile semiconductor memory is configured to transmit and receive a signal to and from a host device via the signal terminal. The selection circuit is configured to determine whether to connect the signal terminal to the power line via the resistance element.

Hereinafter, certain example embodiments will be described with reference to the drawings. In description of the drawings, the same components are denoted by the same reference numerals, and description thereof can be omitted in describing subsequent drawings.

First Embodiment

As shown in FIG. 1, a memory system 1 according to a first embodiment is configured to be connected to a host device 2. The memory system 1 includes a signal terminal 10, a controller 20, and a nonvolatile semiconductor memory 30. The memory system 1 further includes a first power line Vcc and a second power line Vss. The second power line Vss has a potential lower than that of the first power line Vcc. The potential of the second power line Vss is a reference potential, for example, a ground potential (GND). Hereinafter, the first power line Vcc and the second power line Vss are collectively referred to as a power line in some contexts.

The memory system 1 transmits data, which has been input to an interface circuit 22 of the controller 20 via the signal terminal 10, to the nonvolatile semiconductor memory 30. The memory system transmits the data, which has been transmitted from the nonvolatile semiconductor memory 30 thereto, to the host device 2 via the interface circuit 22 and the signal terminal 10. The nonvolatile semiconductor memory 30 is, for example, a NAND flash memory.

The controller 20 controls transmission and reception of a signal between the host device 2 and the nonvolatile semiconductor memory 30. For example, the controller 20 controls an operation of writing data into the nonvolatile semiconductor memory 30 according to a write request from the host device 2. The controller 20 controls an operation of reading data from the nonvolatile semiconductor memory 30 according to a read request from the host device 2.

The controller 20 includes a selection circuit 21. The selection circuit 21 includes a first selection unit 211 and a second selection unit 212. The first selection unit 211 includes a first resistance element (hereinafter, referred to as a "pull-up resistor R21"). The first selection unit 211 selects whether to connect the signal terminal 10 to the first power line Vcc via the pull-up resistor R21. The second selection unit 212 includes a second resistance element (hereinafter, referred to as a "pull-down resistor R22"). The second selection unit 212 selects whether to connect the signal terminal 10 to the second power line Vss via the pull-down resistor R22.

Hereinafter, the pull-up resistor R21 and the pull-down resistor R22 are collectively referred to as a "resistance element R20" in some contexts. In the present embodiment, the selection circuit 21 selects whether to connect the signal terminal 10 to the power line via the resistance element R20.

The pull-up resistor R21 that connects the signal terminal 10 to the first power line Vcc raises the potential of the signal terminal 10. The pull-down resistor R22 that connects the signal terminal 10 to the second power line Vss lowers the potential of the signal terminal 10.

A central processing unit (CPU) 23 of the controller 20 integrally controls an operation of the memory system 1. The CPU 23 transmits a pull-up signal Pu for controlling an operation of the first selection unit 211 and a pull-down signal Pd for controlling an operation of the second selection unit 212 to the selection circuit 21 as control signals. The setting register 24 stores information associated with a setting of a connection between the signal terminal 10 and the power line via the resistance element R20. The CPU 23 sets the control signal with reference to the setting register 24.

The CPU 23 controls whether the signal terminal 10 is connected to the first power line Vcc via the pull-up resistor R21 using the pull-up signal Pu. The CPU 23 controls whether the signal terminal 10 is connected to the second power line Vss via the pull-down resistor R22 using the pull-down signal Pd. Hereinafter, a first connection between the signal terminal 10 and the first power line Vcc via the pull-up resistor R21 is also referred to as a "pull-up connection" in some contexts. A second connection between the signal terminal 10 and the second power line Vss via the pull-down resistor R22 is also referred to as a "pull-down connection" in some contexts.

Figure 2:
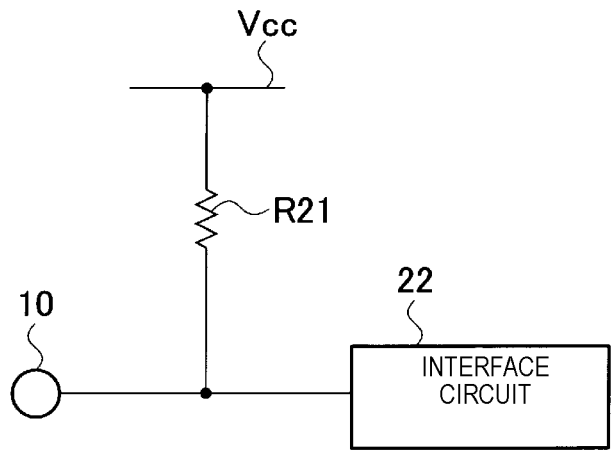
FIG. 2 is an equivalent circuit diagram showing a connection state of the memory system according to a first embodiment.
Figure 3:
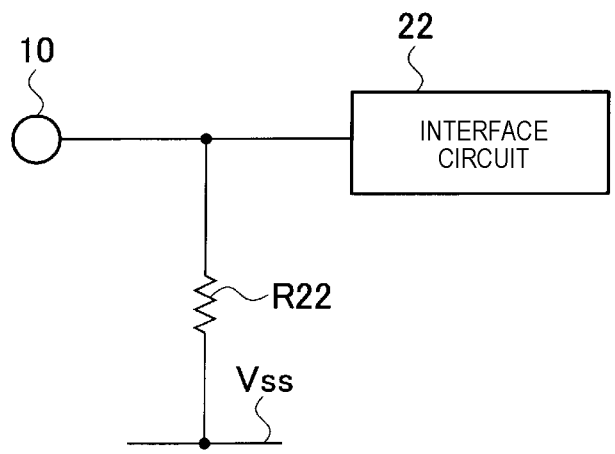
FIG. 3 is an equivalent circuit diagram showing another connection state of the memory system according to a first embodiment.

The controller 20 sets either the pull-up connection or the pull-down connection. Alternatively, the controller 20 sets neither the pull-up connection nor the pull-down connection. FIG. 2 shows an equivalent circuit diagram showing a pull-up connection state. FIG. 3 shows an equivalent circuit diagram showing a pull-down connection state.

Figure 4:
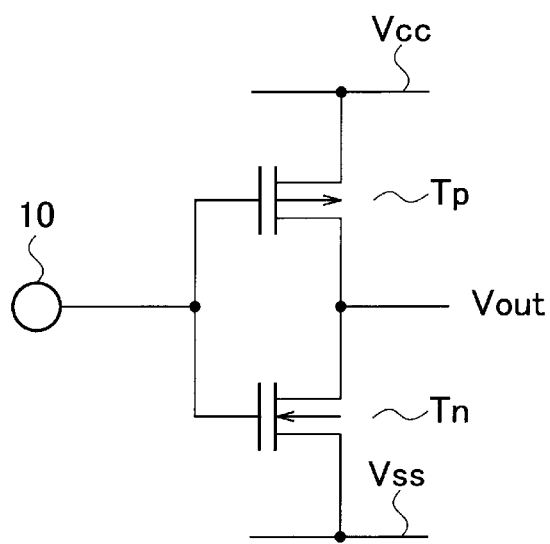
FIG. 4 is an equivalent circuit diagram of an interface circuit of the memory system according to a first embodiment.

The memory system 1 is advantageous, for example, when the interface circuit 22 includes an input stage shown in FIG. 4.

In the input stage of the interface circuit 22 shown in FIG. 4, when the signal terminal 10 receives a signal "1", a P-channel transistor Tp is turned off and a N-channel transistor Tn is turned on. Therefore, an output terminal Vout is at a low (L) state. When the signal terminal 10 receives a signal "0", the P-channel transistor Tp is turned on and the N-channel transistor Tn is turned off. Therefore, the output terminal Vout is at a high (H) state.

On the other hand, when the signal terminal 10 does not receive a signal or the like, the signal terminal 10 is at an intermediate state between the signal "1" and the signal "0", and neither the P-channel transistor Tp nor the N-channel transistor Tn may be in an off state. In this case, a through current flows from the first power line Vcc to the second power line Vss through the P-channel transistor Tp and the N-channel transistor Tn, an operating power increases, and a Vout signal in FIG. 4 may become unstable, which may cause a malfunction inside the memory system 1.

Therefore, it is effective to connect the pull-up resistor R21 to the signal terminal 10 or to connect the pull-down resistor R22 to the signal terminal 10. In one embodiment, whether to set the pull-up connection or the pull-down connection for the signal terminal 10 can be arbitrarily selected according to a use method or the like of the memory system 1.

For example, in a case of connection to the host device 2 outside the memory system 1, when the unused signal terminal 10 and the first power line Vcc are connected on a substrate, an unnecessary current may flow from the first power line Vcc to the second power line Vss via the signal terminal 10 when the pull-down resistor R22 is connected to the signal terminal 10. Therefore, the controller 20 controls the first selection unit 211 to connect the signal terminal 10 to the first power line Vcc via the pull-up resistor R21. The controller 20 sets the pull-up connection and does not set the pull-down connection.

In a case of connection to the host device 2 outside the memory system 1, when the unused signal terminal 10 and the second power line Vss are connected on the substrate, the unnecessary current may flow from the first power line Vcc to the second power line Vss via the signal terminal 10 when the pull-up resistor R21 is connected to the signal terminal 10. Therefore, the controller 20 controls the second selection unit 212 to connect the signal terminal 10 to the second power line Vss via the pull-down resistor R22. The controller 20 sets the pull-down connection and does not set the pull-up connection.

Selecting whether to connect the signal terminal 10 to the power line via the resistance element R20 may be performed by various methods or configurations. For example, a selection switch may be connected in series with the resistance element R20 between the signal terminal 10 and the power line. Then, the controller 20 controls the selection switch to set a connection state between the signal terminal 10 and the power line.

Figures 5, 6:
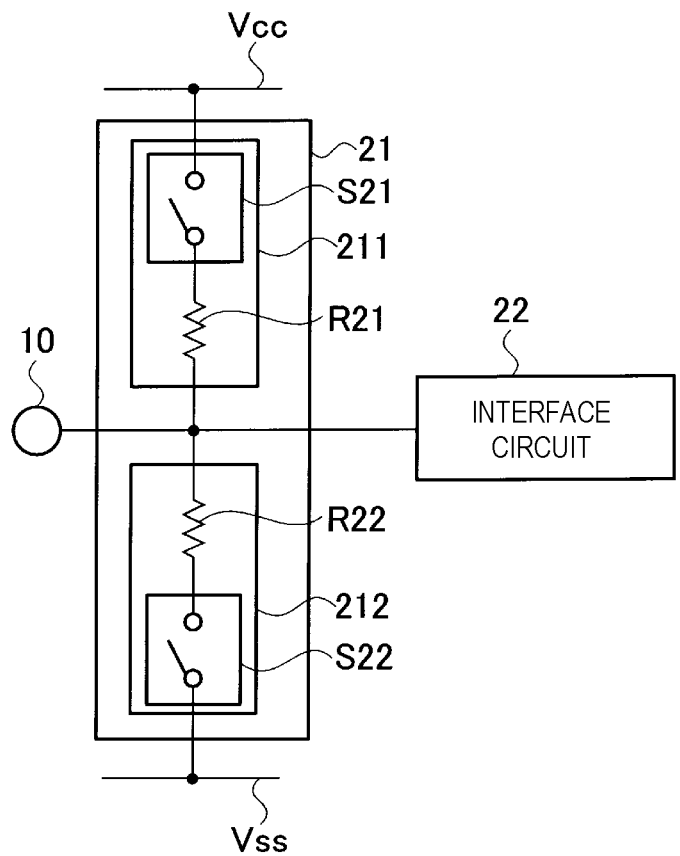
FIG. 5 is an equivalent circuit diagram of a selection circuit of a memory system according to a first embodiment.
FIG. 6 is a table showing an example of a setting register of a memory system according to a first embodiment.

In the present embodiment, as shown in FIG. 5, the first selection unit 211 includes a first selection switch S21 connected in series with the pull-up resistor R21 between the signal terminal 10 and the first power line Vcc. The controller 20 controls an on and off state of the first selection switch S21 using the pull-up signal Pu to set the connection state between the signal terminal 10 and the first power line Vcc. The second selection unit 212 includes a second selection switch S22 connected in series with the pull-down resistor R22 between the signal terminal 10 and the second power line Vss. The controller 20 controls an on and off state of the second selection switch S22 using the pull-down signal Pd to set the connection state between the signal terminal 10 and the second power line Vss.

Depending on a use method, a use objective or the like of the memory system 1, neither the pull-up resistor R21 nor the pull-down resistor R22 may be connected to the signal terminal 10. In such a case, the controller 20 sets neither the pull-up connection nor the pull-down connection.

The controller 20 sets, with reference to the setting register 24, either one of the pull-up resistor R21 and the pull-down resistor R22 to be connected to the signal terminal 10, or neither the pull-up resistor R21 nor the pull-down resistor R22 to be connected to the signal terminal 10. FIG. 6 shows an example of the setting register 24. As shown in FIG. 6, when a setting of the setting register 24 is (0, 0), the selection circuit 21 does not set the pull-up connection (Off) and does not set the pull-down connection (Off). When the setting of the setting register 24 is (0, 1), the selection circuit 21 does not set the pull-up connection (Off) and sets the pull-down connection (On). When the setting of the setting register 24 is (1, 0), the selection circuit 21 sets the pull-up connection (On) and does not set the pull-down connection (Off).

The CPU 23 transmits the pull-up signal Pu and the pull-down signal Pd associated with the setting of the setting register 24 to the selection circuit 21. For example, when neither pull-up connection nor pull-down connection is set, that is, when the pull-up connection is Off and the pull-down connection is Off, the pull-up signal Pu is "0" and the pull-down signal Pd is "0". When the pull-down connection is set, that is, when the pull-up connection is Off and the pull-down connection is On, the pull-up signal Pu is "0" and the pull-down signal Pd is "1". When the pull-up connection is set, that is, when the pull-up connection is On and the pull-down connection is Off, the pull-up signal Pu is "1" and the pull-down signal Pd is "0".

A user sets the setting register 24 according to a desired setting for the pull-up connection and the pull-down connection, for example, at a time of starting up the memory system 1. The controller 20 determines the pull-up signal Pu and the pull-down signal Pd with reference to the setting of the setting register 24.

The memory system 1 is applicable to, for example, a memory system including a NAND flash memory that conforms to a serial peripheral interface (SPI). The memory system 1 conforming to SPI operates in a single SPI mode in which 1-bit data is propagated for one clock, or a quad SPI mode in which 4-bit data is propagated for one clock. Hereinafter, an operation in the single SPI mode is also referred to as an "X1 operation" and an operation in the quad SPI mode is also referred to as an "X4 operation" in some contexts. FIG. 7 shows an example of a terminal arrangement of the memory system 1 conforming to SPI.

FIG. 8 shows a function of each terminal of the memory system 1 shown in FIG. 7. A first pin is a chip select terminal (/CS terminal) that receives a chip select (CS) signal for setting the memory system 1 in a selected state. A second pin is a serial data output terminal (SO terminal) in the X1 operation and is an IO1 terminal through which serial data propagates in the X4 operation. A third pin is a write protect terminal (/WP terminal) that receives a writ protect (WP) signal for controlling the write operation in the memory system 1 in the X1 operation and is an IO2 terminal through which the serial data propagates in the X4 operation. A fourth pin is a Vss terminal that receives a voltage set for the second power line Vss.

A fifth pin is a serial data input terminal (SI terminal) in the X1 operation and is an IO0 terminal through which the serial data propagates in the X4 operation. A sixth pin is a serial clock terminal (SCK terminal) that receives a serial clock signal SCK. A seventh pin is a hold terminal (/HOLD terminal) that receives a HOLD signal for controlling interruption of input and output of the serial data in the X1 operation and is an IO3 terminal through which the serial data propagates in the X4 operation. An eighth pin is a Vcc terminal that receives a voltage set for the first power line Vcc.

When the memory system 1 is set to the selected state, the /CS terminal is set to the L state. Then, in the X1 operation of the memory system 1, the host device 2 transmits an H state signal to the /HOLD terminal. When the /HOLD terminal receives an L state signal, an operation is temporarily suspended without setting the memory system 1 in a non-selected state.

In order to prevent an unintended write operation, an unintended erasing operation and the like in the nonvolatile semiconductor memory 30, the memory system 1 has a block lock function. The block lock function is released by changing a BL bit register in the memory system 1. When the BL bit register is changed, the H state signal is transmitted from the host device 2 to the /WP terminal. On the other hand, when the /WP terminal receives the L state signal and a BRWD bit register is "1", the BL bit register cannot be changed.

Depending on a use state or the like of the memory system 1, a control signal may not be input to the /HOLD terminal or the /WP terminal. In that case, a through current flows from the first power line Vcc to the second power line Vss through the P-channel transistor Tp and the N-channel transistor Tn. An unintended and unnecessary current (through current) maybe generated inside the memory system 1, and a Vout signal may become unstable and thus may malfunction inside the memory system 1. Setting the pull-up connection or the pull-down connection to the /HOLD terminal or the /WP terminal is effective in preventing the through current and the malfunction.

However, in the X4 operation, the /HOLD terminal and /WP terminal are used as IO terminals through which data propagates. Therefore, when the pull-up resistor R21 or the pull-down resistor R22 is connected to the /HOLD terminal and /WP terminal, the current flows via the pull-up resistor R21 or the pull-down resistor R22 when the write data is transferred from the host device 2. As a result, the operating power of the memory system 1 is increased.

In contrast, in the memory system 1, the selection circuit 21 selects whether to connect the /HOLD terminal and the /WP terminal to the power line via the resistance element R20. For example, in the X1 operation, the selection circuit 21 connects the /HOLD terminal and the /WP terminal to the power line via the resistance element R20. Then, in the X4 operation, the selection circuit 21 does not connect the /HOLD terminal and /WP terminal to the power line via the resistance element R20. When either one of the /HOLD terminal and the /WP terminal is connected to the power line via the resistance element R20, the selection circuit 21 selects a setting of a connection for at least the terminal to which the resistance element R20 is connected.

The setting register 24 is used for setting each of the /HOLD terminal and the /WP terminal. With reference to the setting register 24, the controller 20 independently sets either pull-up connection or pull-down connection or sets neither pull-up connection nor pull-down connection for each of the /HOLD terminal and the /WP terminal.

The controller 20 can dynamically change the connection state between the signal terminal 10 and the power line without stopping the operation of the memory system 1 according to a signal transmitted from the host device 2 to the memory system 1 to switch between the single SPI mode and the quad SPI mode. For example, at a timing of switching from the quad SPI mode to the single SPI mode, the controller 20 dynamically changes a state in which the resistance element R20 is disconnected from between the signal terminal 10 and the power line to a state in which the signal terminal 10 is connected to the power line via the resistance element R20. At a timing of switching from the single SPI mode to the quad SPI mode, the controller 20 dynamically changes the state in which the signal terminal 10 is connected to the power line via the resistance element R20 to the state in which the resistance element R20 is disconnected from between the signal terminal 10 and the power line.

Figure 9:
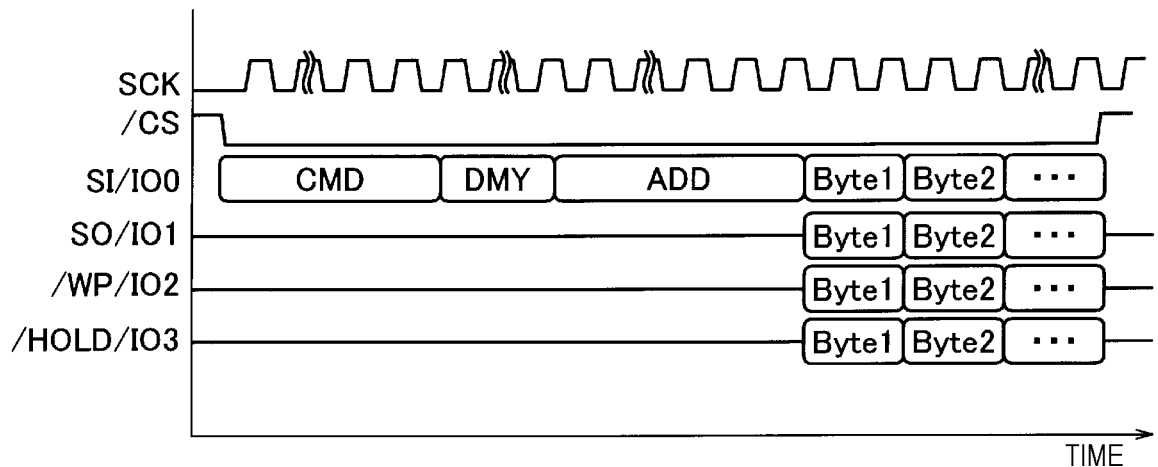
FIG. 9 is a timing chart of an operation of a memory system according to a first embodiment.

The memory system 1 conforming to SPI executes signal input in the quad SPI mode, for example, as in a timing chart shown in FIG. 9. The host device 2 asserts the CS signal (or sets the CS signal to the L state) and transmits a write command CMD to the SI terminal. Further, the host device 2 transmits the serial clock signal SCK to the SCK terminal. By receiving the write command CMD in the quad SPI mode, the memory system 1 starts to receive data in the quad SPI mode. The write command CMD in the quad SPI mode is, for example, "32h", "34h/C4h", or the like.

As shown in FIG. 9, the host device 2 transmits a dummy bit DMY to the SI terminal subsequent to the write command CMD in the quad SPI mode. Next, the host device 2 transmits an address signal ADD specifying an address to which data is to be written to the SI terminal. The address signal ADD is, for example, an address for specifying a column in a page in the NAND flash memory. Thereafter, the host device 2 transmits data signals Byte1, Byte2, etc., which are write data, to the IO0 terminal to the IO3 terminal.

In a series of operations of the memory system 1, when the SI terminal receives the write command CMD in the quad SPI mode, the controller 20 transmits the pull-up signal Pu and the pull-down signal Pd to the selection circuit 21. The selection circuit 21 disconnects the resistance element R20 from the signal terminal 10 in a data transfer phase according to the pull-up signal Pu and the pull-down signal Pd. Accordingly, the operating power due to the connection of the pull-up resistor R21 and the pull-down resistor R22 to the signal terminal 10 can be reduced.

After a series of operations according to an external command transmitted from the host device 2 to the memory system 1 is completed, the controller 20 may transmit the pull-up signal Pu and the pull-down signal Pd to the selection circuit 21 and connect the signal terminal 10 to the power line via the resistance element R20. For example, at a timing when the H state CS signal is received from the host device 2, the controller 20 transmits the pull-up signal Pu and the pull-down signal Pd to the selection circuit 21.

In this way, the memory system 1 can dynamically change a state in which the pull-up resistor R21 or the pull-down resistor R22 is connected to the signal terminal 10 and a state in which the pull-up resistor R21 or the pull-down resistor R22 is not connected to the signal terminal 10 while continuing the operation of the memory system 1.

In the first embodiment, it is possible to dynamically connect or disconnect the pull-up resistor R21 or the pull-down resistor R22 and the signal terminal 10. Accordingly, the operating power in the memory system 1 can be reduced. For example, the memory system 1 conforming to SPI prevents the current flowing via the pull-up resistor R21 and the pull-down resistor R22 in the X4 operation and reduces the operating power.

The host device 2 may be an information processing device which is a personal computer or the like, a mobile phone, an imaging device, or a mobile terminal which is a tablet computer, a smartphone, or the like. Alternatively, the host device 2 may be a game device, or may be an in-vehicle terminal such as a car navigation system. The host device 2 may be a microprocessor in an information processing device, a mobile phone, a mobile terminal, an in-vehicle terminal, or the like.

Although certain example cases have been described as for which the nonvolatile semiconductor memory 30 is a NAND flash memory, the nonvolatile semiconductor memory 30 may be another type of nonvolatile semiconductor memory.

Modified Embodiments

Figure 10:
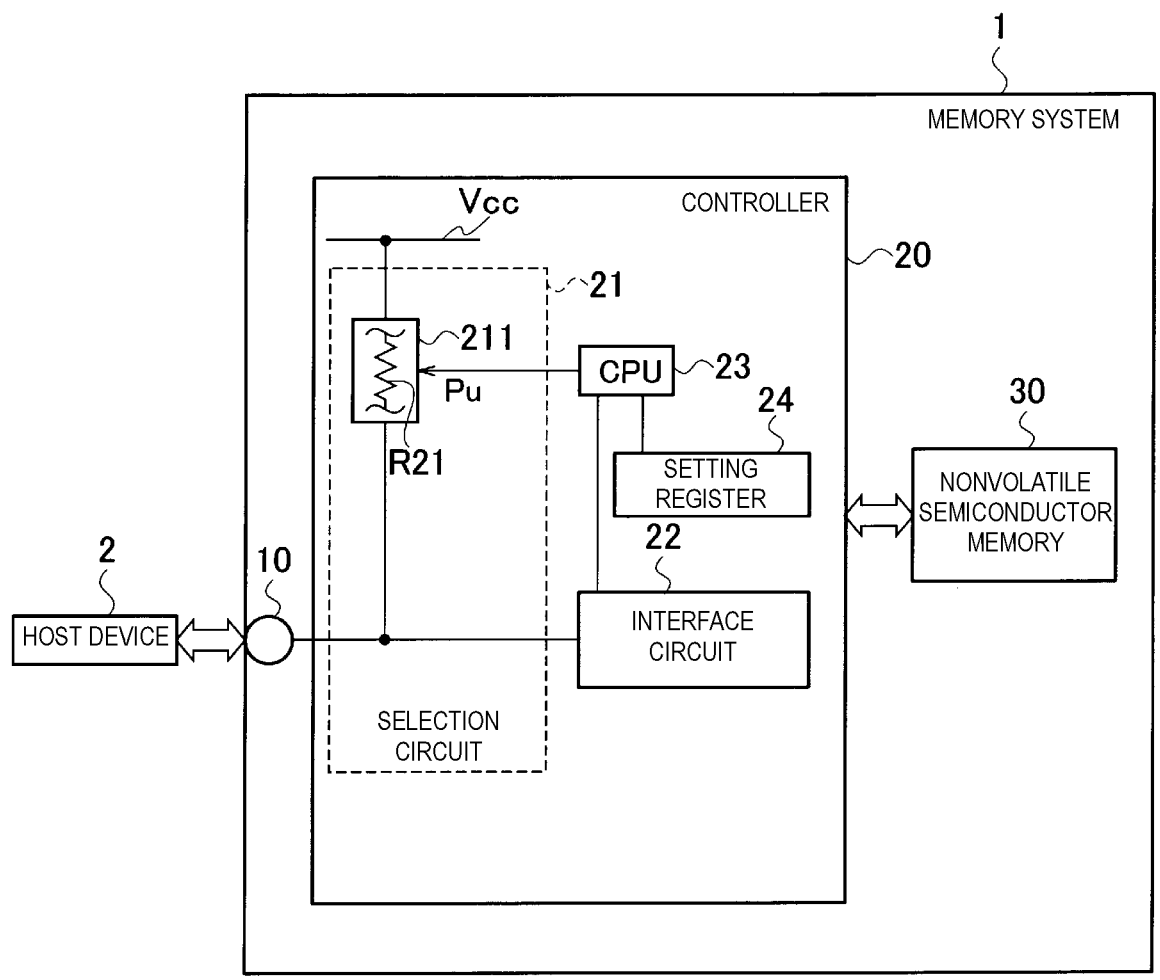
FIG. 10 depicts a memory system according to a modification of a first embodiment.

In the first embodiment, the memory system 1 or the selection circuit 21 comprises both the pull-up resistor R21 and the pull-down resistor R22 as shown in FIG. 1. In one modified embodiment, if the pull-down resistor R22 is not required to be connected to the signal terminal 10, the selection circuit 21 may include the first selection unit 211 and may not include the second selection unit 212 as shown in FIG. 10.

Figure 11:
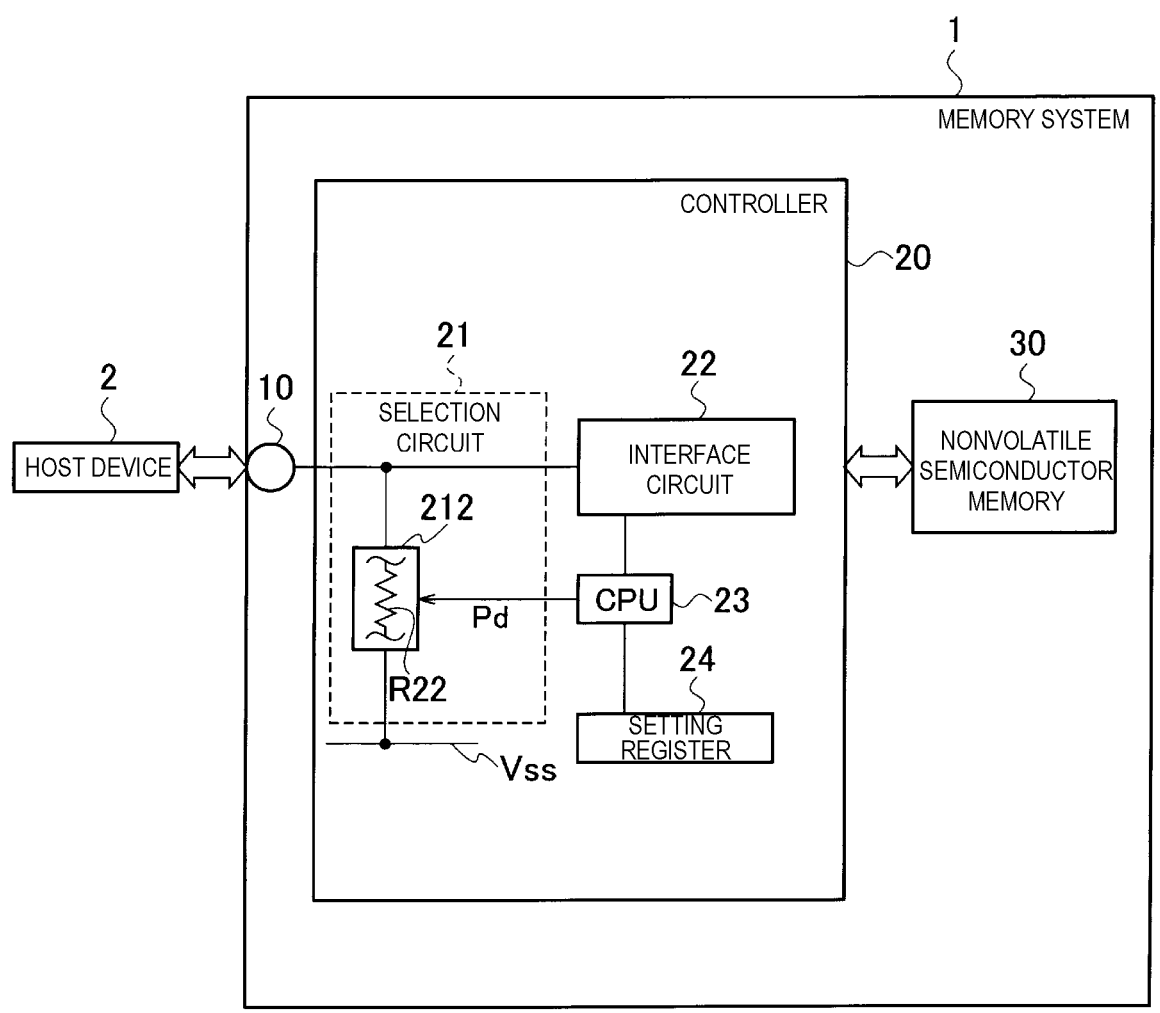
FIG. 11 depicts a memory system according to another modification of a first embodiment.

In one modified embodiment, if the pull-up resistor R21 is not required to be connected to the signal terminal 10, the selection circuit 21 may include the second selection unit 212 and may not include the first selection unit 211 as shown in FIG. 11. In a further modified embodiment, a configuration of the memory system 1 shown in FIGS. 10 and 11 can be further simplified.

Second Embodiment

Figure 12:
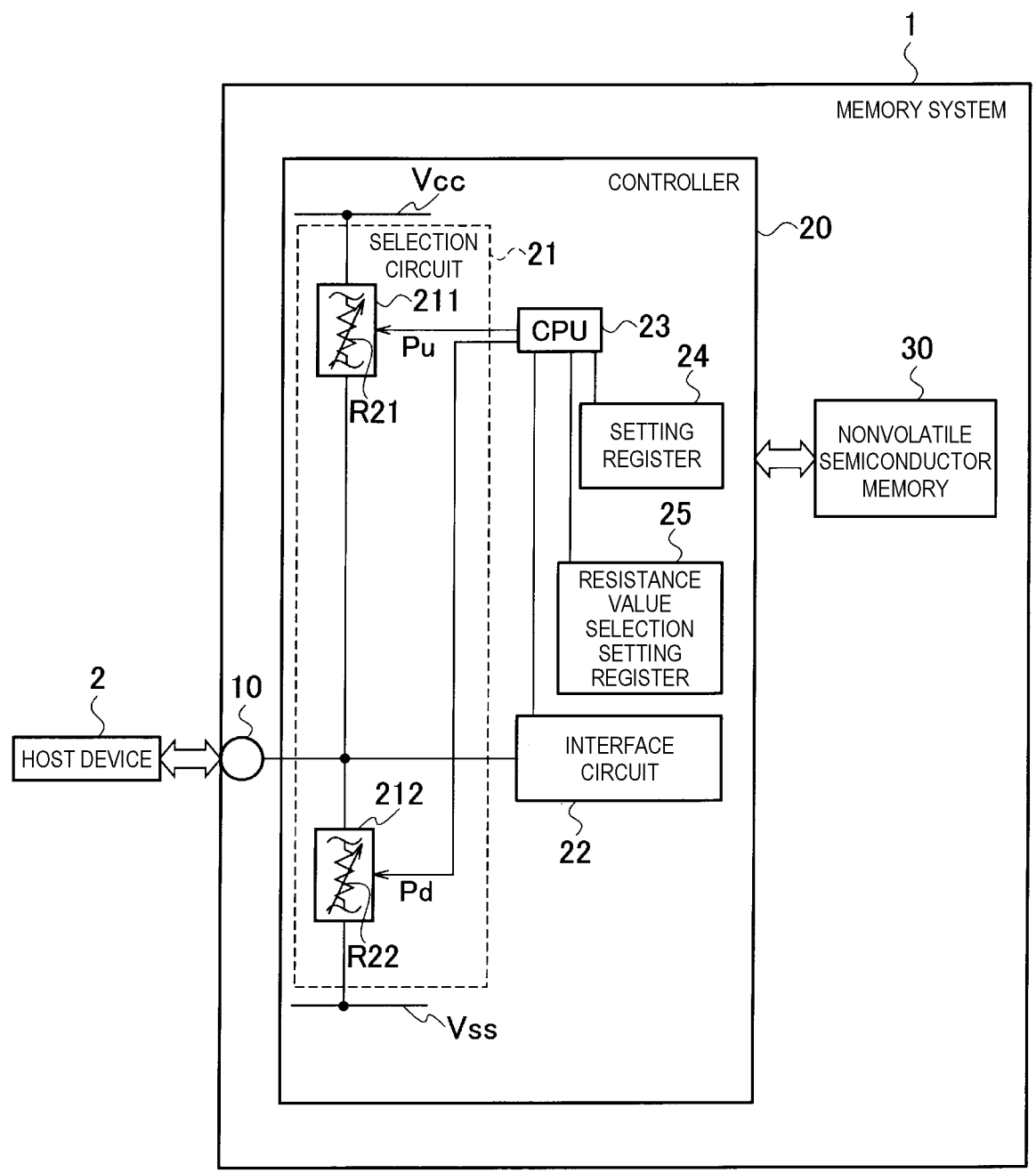
FIG. 12 depicts a memory system according to a second embodiment.

The memory system 1 according to a second embodiment comprises a resistance element R20 whose resistance value is variable as shown in FIG. 12. The controller 20 selects the resistance value of the resistance element R20 from a plurality of candidate resistance values.

In the memory system 1 shown in FIG. 12, the resistance value of the pull-up resistor R21 provided in the first selection unit 211 is variable, and the resistance value of the pull-down resistor R22 provided in the second selection unit 212 is variable. Other configurations are substantially the same as those in the first embodiment shown in FIG. 1.

In some instances, the selection circuit 21 may include the resistance element R20 which is a variable resistor whose resistance value can be changed using an electric signal or the like. In other instances, the selection circuit 21 may include a plurality of resistance elements having mutually different resistance values. The selection circuit 21 including the plurality of resistance elements selects one resistance element as the resistance element R20 from the plurality of resistance elements according to the pull-up signal Pu and the pull-down signal Pd. For example, the plurality of resistor elements and a switch that switches connection of these resistance elements are connected in series between a power line and the signal terminal 10. Then, the controller 20 controls a setting of the switch to set the resistance value of the resistance element R20.

The memory system 1 shown in FIG. 12 includes a resistance value selection setting register 25 associated with the plurality of candidate resistance values that can be set for the resistance element R20. With reference to a setting of the resistance value selection setting register 25, the controller 20 selects the resistance value of the resistance element R20 from the plurality of candidate resistance values.

FIG. 13 shows an example of correspondence between the setting of the resistance value selection setting register 25 and the candidate resistance values. As shown in FIG. 13, the controller 20 selects the candidate resistance value of 1 kΩ when the setting of the resistance value selection setting register 25 is (0, 0). The controller 20 selects the candidate resistance value of 10 kΩ when the setting of the resistance value selection setting register 25 is (0, 1). The controller 20 selects the candidate resistance value of 50 kΩ when the setting of the resistance value selection setting register 25 is (1, 0). The controller 20 selects the candidate resistance value of 100 kΩ when the setting of the resistance value selection setting register 25 is (1, 1). For example, when the memory system 1 is started up, the resistance value selection setting register 25 is set by a user or the like so as to correspond to a desired resistance value of the resistance element R20.

In one embodiment, as shown in FIG. 14, the memory system 1 conforming to SPI includes the setting register 24 and the resistance value selection setting register 25 for each of a /HOLD terminal and a /WP terminal. With reference to the setting register 24 and the resistance value selection setting register 25, the controller 20 sets either one of the pull-up resistor R21 and the pull-down resistor R22 to be connected to the /HOLD terminal and /WP terminal or sets neither the pull-up resistor R21 nor the pull-down resistor R22 to be connected to the /HOLD terminal and /WP terminal, including the resistance value of the resistance element R20. Therefore, in the memory system 1 shown in FIG. 12, the pull-up signal Pu and the pull-down signal Pd are control signals of a large number of bits associated with the setting of the setting register 24 and the setting of the resistance value selection setting register 25. The setting of the resistance value selection setting register 25 regarding the pull-up resistor R21 is more effective in a case where the pull-up connection is set. The setting of the resistance value selection setting register 25 regarding the pull-down resistor R22 is more effective in a case where the pull-down connection is set.

By reducing the resistance value of the resistance element R20, time until a potential of the signal terminal 10 becomes stable can be shortened at a time of connection to the power line via the resistance element R20. Malfunction of the memory system 1 when noise is applied to the signal terminal 10 can be reduced. Furthermore, by increasing the resistance value of the resistance element R20, the current flowing via the resistance element R20 can be reduced.

In the second embodiment, the resistance value of each of the pull-up resistor R21 and the pull-down resistor R22 as well as connection and disconnection of the pull-up resistor R21 and the pull-down resistor R22 can be arbitrarily selected by, for example, a user. Accordingly, a degree of design freedom regarding the memory system 1 is improved. The resistance value of one of the pull-up resistor R21 and the pull-down resistor R22 may be variable, and the resistance value of the rest of the pull-up resistor R21 and the pull-down resistor R22 may be fixed.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
a signal terminal;
a power line;
a selection unit with a resistance element, the selection unit being between the signal terminal and the power line;
a nonvolatile semiconductor memory configured to transmit and receive a signal to and from a host device via the signal terminal;
a controller configured to control the selection unit to select whether the signal terminal is connected to the power line via the resistance element;
an interface circuit connected to the signal terminal, the interface circuit conforming to a serial peripheral interface (SPI), wherein
the signal terminal is a /HOLD terminal or a /WP terminal,
the signal terminal is connected to the power line via the resistance element in a single SPI mode,
the controller controls the selection unit such that the signal terminal is not connected to the power line via the resistance element in a quad SPI mode and is connected to the power line via the resistance element in a single SPI mode,
the controller controls the selection unit to switch between the single SPI mode and the quad SPI mode according to a signal transmitted from the host device,
the controller switches the selection unit to switch between connecting the power terminal to the signal terminal via the resistance element or not without stopping operation of the memory system,
when switching from the quad SPI mode to the single SPI mode, the controller controls the selection unit to connect the power line to the signal terminal via the resistance element, and
when switching from the single SPI mode to the quad SPI mode, the controller controls the selection unit to not connect the power line to the signal terminal via the resistance element.

2. The memory system according to claim 1, further comprising:
a setting register associated with a setting of a connection state between the signal terminal and the power line, wherein
the controller controls the selection unit in accordance with the setting register.

3. The memory system according to claim 1, wherein the nonvolatile semiconductor memory is a NAND flash memory.

4. The memory system according to claim 1, wherein
the selection unit comprises a selection switch in series with the resistance element between the signal terminal and the power line, and
the controller controls the selection switch to set a connection state between the signal terminal and the power line.

5. A memory system, comprising:
a signal terminal;
a power line;
a selection unit with a resistance element, the selection unit being between the signal terminal and the power line;
a nonvolatile semiconductor memory configured to transmit and receive a signal to and from a host device via the signal terminal;
a controller configured to control the selection unit to select whether the signal terminal is connected to the power line via the resistance element;
a setting register associated with a setting of a connection between the signal terminal and the power line; and
a resistance value selection setting register associated with a plurality of candidate resistance values to be set for the resistance element, wherein
the resistance element is a variable resistor,
the signal terminal comprises a /HOLD terminal and a /WP terminal, and
the controller sets selection unit so the resistance element is connected to the /HOLD terminal and /WP terminal or not based on the setting register and sets resistance of the resistance element based on the resistance value selection setting register.

6. A controller for a memory system, comprising:
a selection unit with a resistance element, the selection unit being connected between a power line and a signal terminal; and
a controller configured to control the selection unit to select whether the signal terminal is connected to the power line via the resistance element or not; and an interface circuit between a nonvolatile semiconductor memory and the signal terminal, the interface circuit conforming to a serial peripheral interface (SPI), wherein the signal terminal is at least one of a /HOLD terminal or a /WP terminal, the controller controls the selection unit such that the signal terminal is not connected to the power line via the resistance element in a quad SPI mode and is connected to the power line via the resistance element in a single SPI mode, the controller controls the selection unit to switch between the single SPI mode and the quad SPI mode according to a signal transmitted from a host device, the controller switches the selection unit to switch between connecting the power terminal to the signal terminal via the resistance element or not without stopping operation of the memory system, when switching from the quad SPI mode to the single SPI mode, the controller controls the selection unit to connect the power line to the signal terminal via the resistance element, and when switching from the single SPI mode to the quad SPI mode, the controller controls the selection unit to not connect the power line to the signal terminal via the resistance element.

7. The controller according to claim 6, wherein the selection unit further includes a switch element connected in series with the resistance element.

8. The controller according to claim 6, wherein the power line is a ground line.

9. The controller according to claim 6, wherein the resistance element is a variable resistor.

10. The memory system according to claim 1, wherein the selection unit further includes a switch element connected in series with the resistance element.

11. The memory system according to claim 1, wherein the power line is a ground line.

12. The memory system according to claim 1, wherein the resistance element is a variable resistor.

13. The memory system according to claim 5, wherein the selection unit further includes a switch element connected in series with the resistance element.

14. The memory system according to claim 5, wherein the power line is a ground line.

15. The memory system according to claim 5, wherein the resistance element is a variable resistor.

* * * * *